(12) United States Patent
Grebs

(10) Patent No.: US 6,238,981 B1
(45) Date of Patent: May 29, 2001

(54) PROCESS FOR FORMING MOS-GATED DEVICES HAVING SELF-ALIGNED TRENCHES

(75) Inventor: Thomas Eugene Grebs, Mountaintop, PA (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/307,879

(22) Filed: May 10, 1999

(51) Int. Cl.[7] .................................................. H01L 21/336
(52) U.S. Cl. ............................................................ 438/272
(58) Field of Search ................................. 438/270, 272, 438/271

(56) References Cited

U.S. PATENT DOCUMENTS

| | | | |
|---|---|---|---|
| 4,767,722 | * 8/1988 | Blanchard | 437/41 |
| 4,983,535 | * 1/1991 | Blanchard | 437/40 |
| 5,082,795 | * 1/1992 | Temple | 437/41 |
| 5,100,823 | * 3/1992 | Yamada | 437/52 |
| 5,316,959 | * 5/1994 | Kwan et al. | 437/40 |
| 5,393,704 | 2/1995 | Huang et al. . | |
| 5,567,634 | * 10/1996 | Hebert et al. | 437/41 |
| 5,665,619 | 9/1997 | Kwan et al. . | |
| 5,684,319 | * 11/1997 | Hebert | 257/336 |
| 5,716,886 | 2/1998 | Wen . | |
| 5,726,463 | * 3/1998 | Brown et al. | 257/77 |
| 5,891,776 | * 4/1999 | Han et al. | 438/274 |
| 5,940,689 | * 8/1999 | Rexer et al. | 438/133 |

* cited by examiner

Primary Examiner—Olik Chaudhuri
Assistant Examiner—Shrinivas H. Rao
(74) Attorney, Agent, or Firm—Jaeckle Fleischmann & Mugel, LLP

(57) ABSTRACT

In a process for forming an MOS-gated device having self-aligned trenches, a screen oxide layer and then a nitride layer are formed on an upper layer of a semiconductor substrate. The nitride layer is patterned and etched to define a well region in the upper layer, and ions of a first conductivity type are diffused into the masked upper layer to form the well region. Ions of a second, opposite conductivity type are implanted into the well region to form a source region extending to a selected depth that defines a source-well junction. After removal of the well mask to expose the previously masked portion of the nitride layer, an oxide insulating layer providing a hard mask is formed overlying the well and source regions. The remaining previously masked portions of the nitride layer and underlying screen oxide layer are removed to expose the portion of the substrate not masked by the oxide insulating layer. The portion of the substrate thus exposed is etched to form a gate trench extending through the substrate to a selected depth beneath the well region. Insulated sidewalls and floor are formed in the gate trench, which is filled with a semiconductor material that is then planarized to be substantially coplanar with the upper surface of the oxide insulating layer. An interlevel dielectric layer is formed on the planarized gate trench semiconductor material and oxide layer upper surface. Using a contact window mask on the interlevel dielectric layer and the underlying oxide insulating layer, contact openings are etched to the gate semiconductor material and the source region. The gate semiconductor material and the source region are simultaneously etched through the contact openings, the source region being etched to a depth substantially corresponding to the source-well junction depth. Ions of the first conduction type are implanted through the contact openings into the gate semiconductor material and the source region. After removal of the contact window mask, metal is deposited on the interlevel dielectric layer and in the contact openings, then patterned to form source and gate connectors.

20 Claims, 3 Drawing Sheets

PROCESS FOR FORMING MOS-GATED DEVICES HAVING SELF-ALIGNED TRENCHES

FIELD OF THE INVENTION

The present invention relates to semiconductor devices and, more particularly, to an improved process for forming MOS-gated devices having self-aligned trenches.

BACKGROUND OF THE INVENTION

An MOS transistor that includes a trench gate structure offers important advantages over a planar transistor for high current, low voltage switching applications. In the latter configuration, constriction occurs at high current flows, an effect that places substantial constraints on the design of a transistor intended for operation under such conditions.

A trench gate of a DMOS device typically includes a trench extending from the source to the drain and having sidewalls and a floor that are each lined with a layer of thermally grown silicon dioxide. The lined trench is filled with doped polysilicon. The structure of the trench gate allows less constricted current flow and, consequently, provides lower values of specific on-resistance. Furthermore, the trench gate makes possible a decreased cell pitch in an MOS channel extending along the vertical sidewalls of the trench from the bottom of the source across the body of the transistor to the drain below. Channel density is thereby increased, which reduces the contribution of the channel to on-resistance. The structure and performance of trench DMOS transistors are discussed in Bulucea and Rossen, "Trench DMOS Transistor Technology for High-Current (100 A Range) Switching," in *Solid-State Electronics*, 1991, Vol. 34, No. 5, pp 493–507, the disclosure of which is incorporated herein by reference. In addition to their utility in DMOS devices, trench gates are also advantageously employed in insulated gate bipolar transistors (IGBTs), MOS-controlled thyristors (MCTs), and other MOS-gated devices.

Self-aligned trenches in an MOS device allow the distance between source and trench gate contacts to be substantially reduced, enabling a beneficial increase in packing density for VLSI fabrication. U.S. Pat. No. 5,393,704 to Huang et al., the disclosure of which is incorporated herein by reference, describes a method of forming in and on a substrate a self-aligned trench contact for a device region that includes gate electrodes on the semiconductor substrate, source/drain regions within the substrate, and spacers on the gate electrode sidewalls. The sidewall spacers are used as a mask to provide an opening to the substrate where the trench contact is to be formed.

U.S. Pat. No. 5,716,886 to Wen, the disclosure of which is incorporated herein by reference, describes a method of fabricating a high-voltage MOS device in which a silicon nitride layer is used as a mask to form trench type source/drain regions in a substrate. The trench source/drain regions contain two conductive layers; portions of the same two conductive layers are included in a gate on the substrate surface.

U.S. Pat. No. 5,665,619 to Kwan et al., the disclosure of which is incorporated herein by reference, describes a method of fabricating a DMOS transistor having self-aligned contact trenches that are etched through a masked oxide/nitride/oxide (ONO) sandwich on a silicon substrate. Gate polysilicon is deposited in the trenches and planarized with the nitride layer. The planarized polysilicon is covered with oxide; doping and four additional photolithographic masking steps are employed to form N+ source regions adjacent to the trenches and a P+ body ohmic content region between the source regions.

There is a continuing need for facilitating the fabrication of MOS-gated devices by a simplified process requiring fewer masking steps than are currently used. The present invention meets this need.

SUMMARY OF THE INVENTION

The present invention is directed to a process for forming an MOS-gated device having self-aligned trenches. A screen oxide layer is formed on an upper layer of a semiconductor substrate, and a nitride layer is formed on the screen oxide layer. Using a well mask, the nitride layer is patterned and etched to define a well region in the upper layer, and ions of a first conductivity type are diffused into the masked upper layer to form the well region.

Ions of a second, opposite conductivity type are implanted into the well region of the masked upper layer to form a source region extending to a selected depth that defines a source-well junction. The well mask is removed, exposing the portion of the nitride layer previously underlying the mask. An oxide insulating layer providing a hard mask is formed overlying the well and source regions in the upper layer. The remaining portions of the nitride layer and the screen oxide layer underlying it, which had been protected by the well mask, are removed, thereby exposing the portion of the substrate not masked by the oxide insulating layer.

The portion of the substrate thus exposed is etched to form a gate trench extending through the substrate to a selected depth beneath the well region. Sidewalls and a floor of an insulator are formed in the gate trench, which is filled with a semiconductor. The semiconductor material in the trench is planarized to be substantially coplanar with the upper surface of the oxide insulating layer. An interlevel dielectric layer is formed on the planarized gate trench semiconductor material and the upper surface of the oxide insulating layer. Following formation of a contact window mask on the interlevel dielectric layer, it and the underlying oxide insulating layer are etched to form contact openings to gate semiconductor material and the source region.

The gate semiconductor material and the source region are simultaneously etched through the contact openings, the source region being etched to a depth substantially corresponding to the depth of the source-well junction. Ions of the first conductivity type are implanted through the contact openings into the gate semiconductor material and the source region. The contact window mask is removed, and metal is deposited on the interlevel dielectric layer and in the contact openings, then patterned to form discrete source and gate connectors.

DETAILED DESCRIPTION OF THE INVENTION

Figure 1:
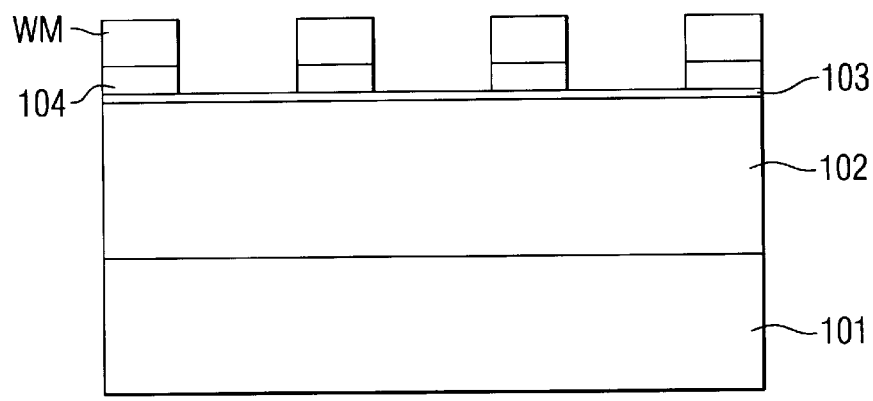
FIGS. 1—1 through 1–9 schematically depict the process for forming an MOS-gated device in accordance with the present invention.

The simplified process of the present invention for fabricating an MOS-gated device is schematically depicted in FIGS. 1—1 through 1–9. As shown in FIG. 1—1, a semiconductor substrate 101 has an upper layer 102, on which is formed a thin screen oxide layer 103. A nitride layer 104 is deposited on layer 103 and patterned by a photoresist well mask WM. Semiconductor substrate 101 preferably comprises monocrystalline silicon, upper layer 102 preferably comprises epitaxially grown silicon, and screen layer 103 preferably comprises silicon dioxide. The deposition of nitride layer 104 can be carried out by chemical vapor deposition (CVD) or low pressure chemical vapor deposition (LPCVD).

Figures 1, 2:
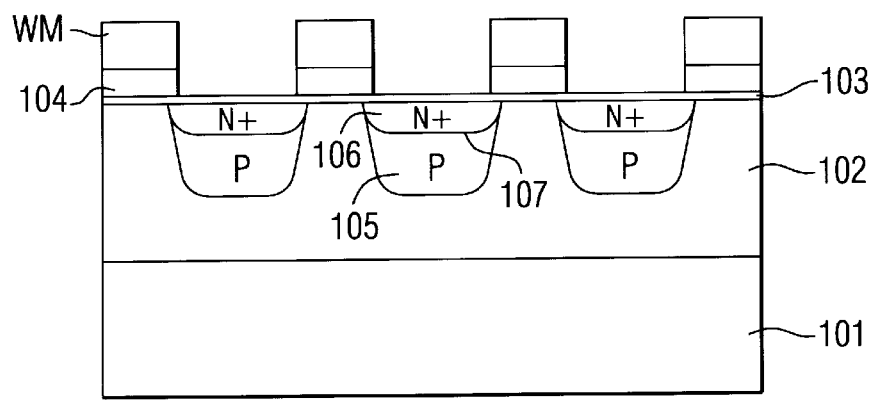

As shown in FIG. 1–2, well regions 105 are formed by implantation and diffusion by ions of a first conductivity type, following which source regions 106 are formed by implantation and diffusion of ions of a second, opposite conductivity type to a selected depth that defines a source-well junction 107. Following formation of well regions 105 and source regions 106, well mask WM is stripped from screen layer 103.

In FIG. 1–2, the first conductivity type is represented as P, producing P-well regions 105, and the second conductivity type is N, resulting in N+ source regions 106. It is understood that these conductivity types can each be reversed to the opposite type. Boron is a preferred P dopant; arsenic and phosphorus are useful N dopants.

Figures 1, 2, 3:
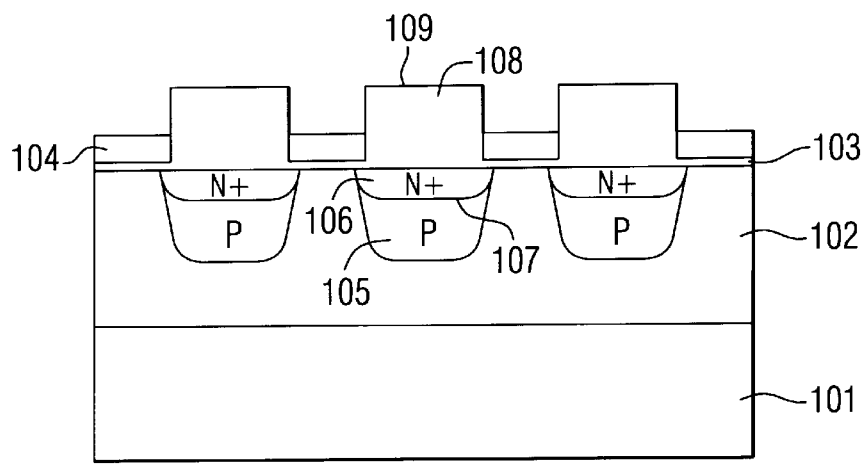
Figures 1, 2, 3, 4:
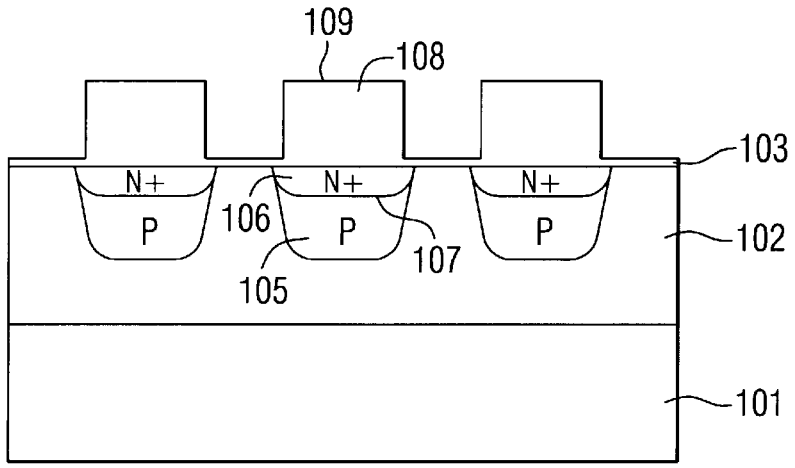
Figures 1, 2, 3, 4, 5:
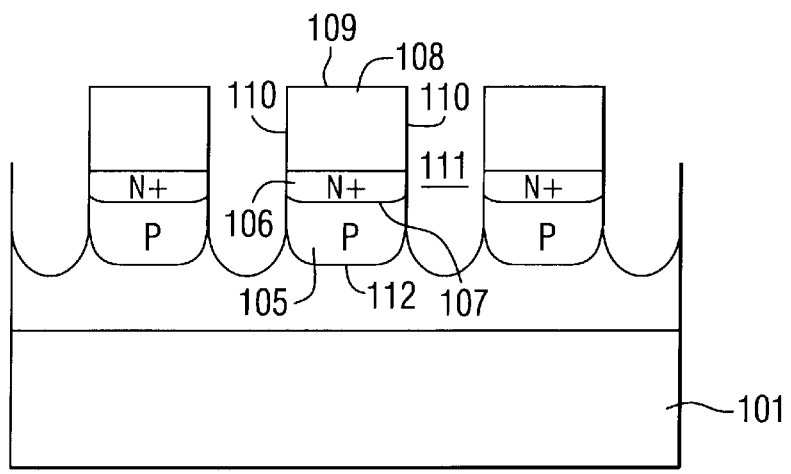
Figures 1, 2, 3, 4, 5, 6:
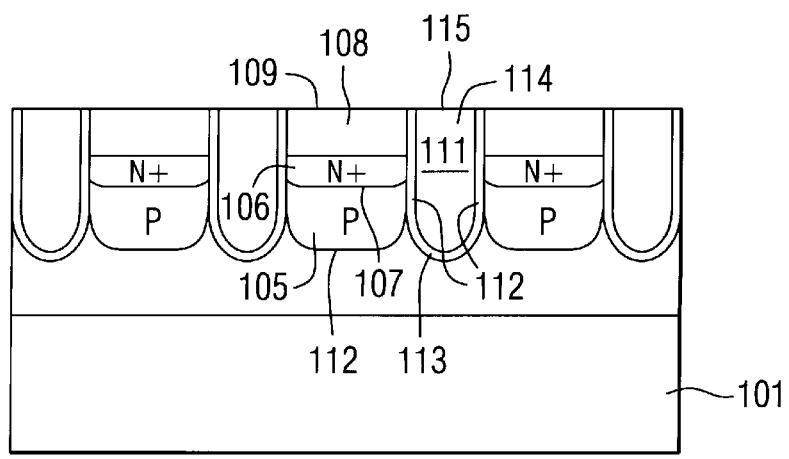
Figures 1, 2, 3, 4, 5, 6, 7:
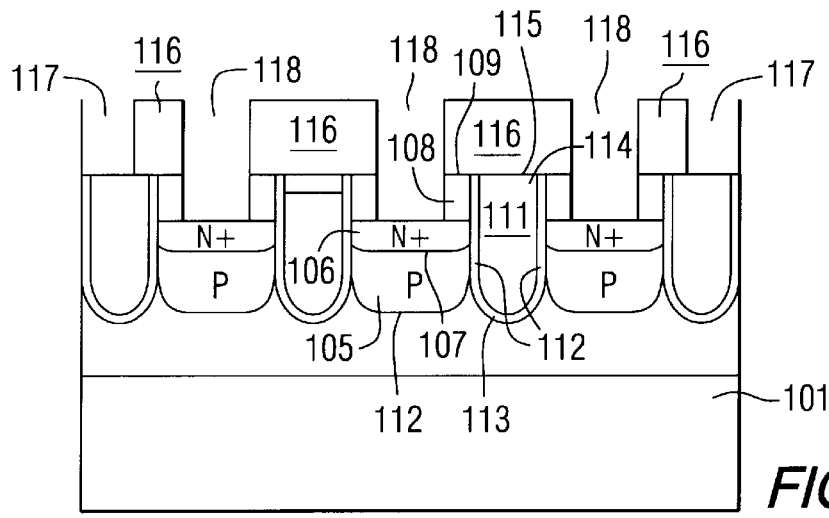
Figures 1, 2, 3, 4, 5, 6, 7, 8:
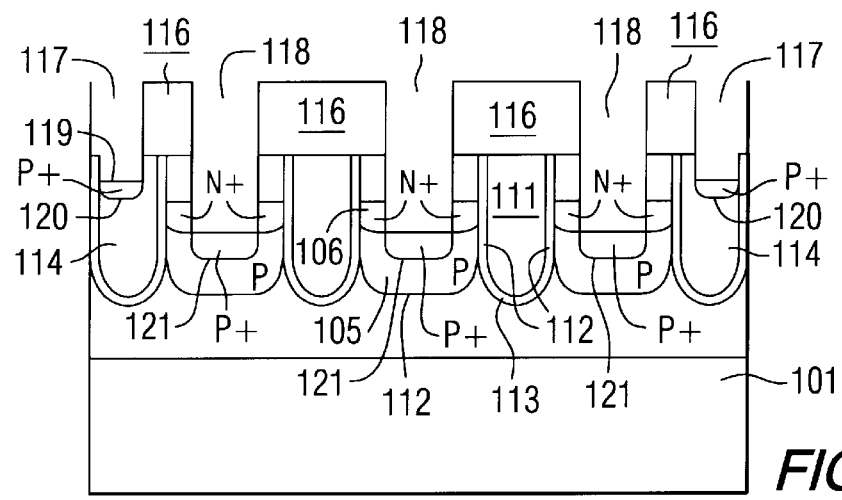
Figures 1, 2, 3, 4, 5, 6, 7, 8, 9:
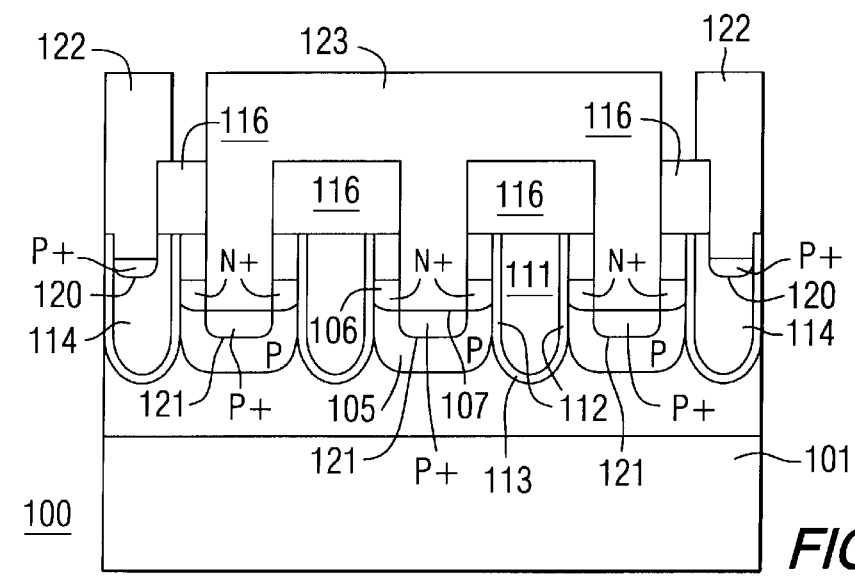

As depicted in FIG. 1–3, an oxide insulating layer 108, preferably silicon dioxide, is formed over source regions 106 and well regions 105. A small amount of oxide insulating layer 108, which has a thickness of at least about 1200 angstroms, is etched to form surface 109; this etching step ensures that any oxide formed on nitride layer 104 is concurrently removed. Nitride layer 104 is then removed by selective etching, leaving the structure depicted in FIG. 1–4.

Oxide insulating layer 108, which has substantially vertical sidewalls 110, provides a hard mask for the etching of trenches 111, which extend substantially to a selected depth 112 below that of well regions 105, as shown in FIG. 1–5. Insulating sidewalls 112 and floor 113, preferably comprising silicon dioxide, are formed in trenches 111, as depicted in FIG. 1–6. Trenches 111 are filled with a semiconductor 114, preferably comprising polysilicon. The semiconductor 114 is planarized by etching or mechanical processing to provide a surface 115 that is substantially coplanar with surface 109 of oxide insulating layer 108.

As shown in FIG. 1–7, an interlevel dielectric layer 116 is deposited on surfaces 109 and 115 and patterned and etched using a contact window mask (not shown) to provide trench contact openings 117 and source contact openings 118. The interlevel dielectric layer 116 can be formed from, for example borophosphosilicate glass (BPSG). Silicon dimple etching using the patterned interlevel dielectric layer 116 as a hard mask is employed to extend trench contact openings 117 to depth 119 and source contact openings 118 through source regions 106 substantially to source-well junctions 107. Implantation and diffusion of ions of the first conductivity type through contact openings 117 and 118 produces P+ regions 120 in gate semiconductor 114 and P+ emitter regions 121 adjacent to source regions 106.

Following removal of the contact window mask (not shown), a metal such as aluminum is deposited and patterned, as shown in FIG. 1–9, to provide gate connectors 122 and source/emitter connectors 123, thereby completing the fabrication of device 100 in accordance with the present invention.

The process of the present invention, which utilizes oxide insulating layer 108 and interlevel dielectric layer 116 as hard masks and requires only three photolithographic masks (well, contact window, and metal), is significantly simpler and more convenient than typical known device fabrication processes.

The invention has been described in detail for the purpose of illustration, but it is understood that such detail is solely for that purpose, and variations can be made therein by those skilled in the art without departing from the spirit and scope of the invention, which is defined by the following claims.

What is claimed:

1. A process for forming an MOS-gated device having self-aligned trenches, said process comprising:
    (a) forming a screen oxide layer on an upper layer of a semiconductor substrate;
    (b) forming a nitride layer on said screen layer;
    (c) using a well mask, patterning and etching said nitride layer, thereby defining a well region in the masked upper layer of the substrate;
    (d) implanting and diffusing ions of a first conductivity type into the masked upper layer, thereby forming a well region in said upper layer;
    (e) implanting and diffusing ions of a second, opposite conductivity type into the well region of the masked upper layer under conditions effective to form a source region extending to a selected depth in said upper layer, said selected depth defining a source-well junction;
    (f) removing the well mask, thereby exposing the portion of the nitride layer previously underlying said mask;
    (g) forming an oxide insulating layer substantially overlying said well and source regions, said insulating layer forming a hard mask over a portion of the upper layer;
    (h) etching said portion of the nitride layer and screen oxide layer underlying said nitride layer portion, thereby exposing the portion of the upper layer not masked by the oxide insulating layer,
    (i) etching said portion of the upper layer not masked by the oxide insulating layer, thereby forming a gate trench extending into the upper layer to a selected depth below the well region;
    (j) forming sidewalls and a floor comprising an insulator in said trench;
    (k) filling the gate trench with a semiconductor material, and planarizing the semiconductor material in said trench to a surface substantially coplanar with an upper surface of the oxide insulating layer;
    (l) forming an interlevel dielectric layer on the planarized semiconductor material in said trench and the upper surface of the oxide insulating layer;
    (m) forming a contact window mask on the interlevel dielectric layer and etching said interlevel dielectric layer and said oxide insulating layer, thereby forming contact openings to the gate trench semiconductor material and the source region;
    (n) through said contact openings, simultaneously etching the gate trench semiconductor material and the source region, said source region being etched to a depth substantially corresponding to the depth of said source-well junction;
    (o) implanting ions of said first conductivity type through said contact openings into the gate trench semiconductor material and the source region;
    (p) removing said contact window mask and depositing metal on said interlevel dielectric layer and in said contact openings; and
    (q) patterning said metal to form discrete source and gate connectors.

2. The process of claim 1 further comprising:
    following (g), etching a sufficient portion of the oxide insulating layer any oxide present on the portion of the nitride layer previously underlying said well mask.

3. The process of claim 1 wherein said substrate comprises monocrystalline silicon and said upper layer comprises epitaxially grown silicon.

4. The process of claim 1 wherein said screen oxide layer, said oxide insulating layer, and said trench sidewalls and floor each comprise silicon dioxide.

5. The process of claim 4 wherein said oxide insulating layer has a thickness of at least about 1200 angstroms.

6. The process of claim 1 wherein said semiconductor in said gate trench comprises polysilicon.

7. The process of claim 1 wherein said first conduction type is P and said second conduction type is N.

8. The process of claim 1 wherein said first conduction type is N and said second conduction type is P.

9. The process of claim 1 wherein said implanting and diffusing ions of a first conduction type comprises implanting and diffusing boron ions.

10. The process of claim 1 wherein said implanting and diffusing ions of a second conduction type comprises implanting arsenic ions or phosphorus ions.

11. The process of claim 1 wherein said interlevel dielectric layer comprises borophosphosilicate glass.

12. The process of claim 1 wherein said metal comprises aluminum.

13. A process for forming a self-aligned gate trench in a vertical MOS device, said process comprising:

(a) forming a first mask on a upper surface of a semiconductor substrate to define well and source regions in said substrate;

(b) implanting well dopants into said defined well regions and source dopants into said source regions, therefore forming well regions nad source regions in said substrate;

(c) growing an oxide insulating hard mask over said well regions and said source regions;

(d) removing the first mask; and (e) using the oxide insulating hard mask, etching gate trenches between said source regions, said trenches extending into the substrate to a selected depth below said well regions;

(f) forming sidewalls and a floor comprising an insulator in said trench;

(g) filling the gate trench with a semiconductor material, and planarizing the semiconductor material in said trench to a surface substantially coplanar with an upper surface of the oxide insulating hard mask;

(h) forming an interlevel dielectric layer on the planarized semiconductor material in said trench and the upper surface of the oxide insulating hard mask;

(i) forming a contact window mask on the interlevel dielectric layer and etching said interlevel dielectric layer and said oxide insulating layer, thereby forming contact openings to the gate trench semiconductor material and the source region;

(j) through said contact openings, simultaneously etching the gate trench semiconductor material and the source region, said region being etched to a depth substantially corresponding to the depth of said source-well junction;

(k) implanting ions of said first conductivity type through said contact openings into gate trench semiconductor material and the source region;

(l) removing said contact window mask and depositing metal on said interlevel dielectric layer and in said contact openings; and (m) patterning said metal to form discrete source and gate connectors.

14. The process of claim 13 further comprising:

prior to forming said first mask, forming a nitride layer on said substrate.

15. The process of claim 14 further comprising:

using said first mask, patterning and etching said nitride layer.

16. The process of claim 13 wherein said substrate comprises monocrystalline silicon and further includes an upper layer of epitaxially grown silicon.

17. The process of claim 13 wherein said well regions and said source regions are formed in said upper layer of epitaxially grown silicon.

18. The process of claim 13 wherein said well dopants are of P conductivity type and said source dopants are of N conductivity type.

19. The process of claim 13 wherein said well dopants comprise boron ions.

20. The process of claim 13 wherein said source dopants comprise arsenic ions or phosphorus ions.

* * * * *

UNITED STATES PATENT AND TRADEMARK OFFICE
CERTIFICATE OF CORRECTION

PATENT NO.    : 6,238,981 B1
DATED         : May 29, 2001
INVENTOR(S)   : Thomas E. Grebs It is certified that error appears in the above-identified patent and that said Letters Patent is hereby corrected as shown below:

<u>Column 5,</u>
Line 32, please correct the word "nad" to spell -- and --

Signed and Sealed this

Eighteenth Day of June, 2002

*Attest:*

*Attesting Officer*

JAMES E. ROGAN
*Director of the United States Patent and Trademark Office*